United States Patent
Sivilotti et al.

(10) Patent No.: US 6,316,334 B1
(45) Date of Patent: Nov. 13, 2001

(54) METHOD OF FABRICATING VARIOUS-SIZED PASSIVATED INTEGRATED CIRCUIT CHIPS FROM A BORDERLESS GATE ARRAY

(75) Inventors: Massimo Antonio Sivilotti, Sierra Madre; John Edward Tanner, Pasadena; Jin Luo, Monrovia, all of CA (US)

(73) Assignee: Tanner Research, Inc., Pasadena, CA (US)

( * ) Notice: Subject to any disclaimer, the term of this patent is extended or adjusted under 35 U.S.C. 154(b) by 0 days.

(21) Appl. No.: 09/642,394

(22) Filed: Aug. 18, 2000

Related U.S. Application Data

(62) Division of application No. 09/290,495, filed on Apr. 12, 1999.

(51) Int. Cl.[7] .................................................. H01L 21/301
(52) U.S. Cl. ................................................................ 438/462
(58) Field of Search ..................................... 438/401, 462, 438/800, 128, 598; 257/797, 798, 620, 202, 536, 786, 909

(56) References Cited

U.S. PATENT DOCUMENTS 5,217,916 * 6/1993 Anderson et al. ................... 438/128

FOREIGN PATENT DOCUMENTS

02000101054-A * 4/2000 (JP) .............................. H01L/27/118

* cited by examiner

Primary Examiner—Charles Bowers
Assistant Examiner—Craig Thompson
(74) Attorney, Agent, or Firm—Stont, Ura, Buyan & Mullins

(57) ABSTRACT

Effective passivation structures and guard rings can be formed in borderless gate arrays by forming the gates in an array of discrete blocks separated by thin scribe lines in which the substrate is not covered by gates. Diffusions for guard rings can be formed in the substrate for guard ring purposes, and passivation structures can be sealingly attached to the substrate. Various circuit metalizations such as discrete layers or different circuits can be produced with a single mask by covering all but a selected portion of the mask during exposure.

13 Claims, 6 Drawing Sheets

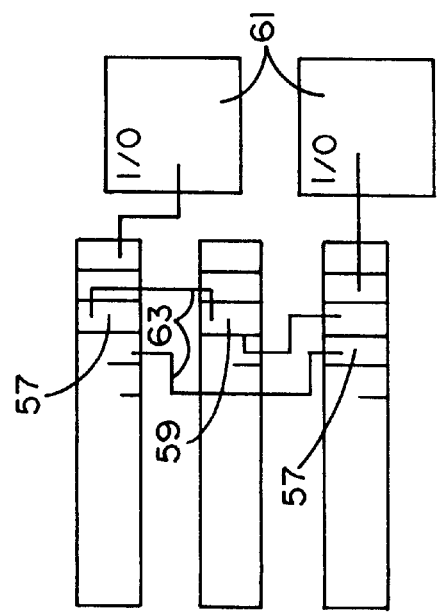
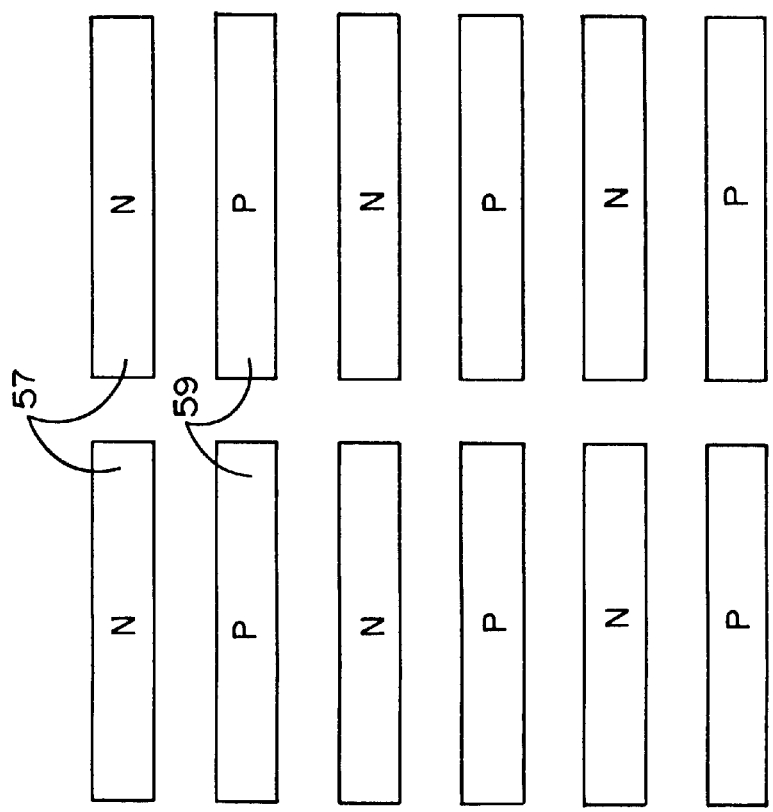
FIG. 4b
FIG. 4a

METHOD OF FABRICATING VARIOUS-SIZED PASSIVATED INTEGRATED CIRCUIT CHIPS FROM A BORDERLESS GATE ARRAY

This Application is a Divisional of Ser. No. 09/290,495 filed Apr. 12,1999.

FIELD OF THE INVENTION

This invention relates to the manufacture of integrated circuit (IC) chips, and more particularly to a method of forming a plurality of passivated IC chips of various sizes, with guard rings and input-output (I/O) pads, from a borderless gate array wafer.

BACKGROUND OF THE INVENTION

IC chips are the heart of practically all modern electronic devices. They are typically manufactured by forming one or more arrays of unconnected gates or transistors on a silicon wafer, and then metalizing the array through masks to form interconnections between gates, and between gates and connection pads, that gives a chip its individuality and functionality.

Wafers are typically available in two types: standard-size arrays and borderless arrays. In the standard-size type, a set of individual arrays of a standard size are formed on each wafer, together with surrounding I/O pads and appropriate passivation structures for chemical isolation against environmental contaminants, as well as guard rings for electrical isolation against stray electromagnetic interference. After the interconnections have been formed, the wafer is cut between the arrays to provide individual finished chips.

In the borderless array type of wafer, a single array is formed to cover the entire surface of the wafer. Individual ICs are produced, after the formation of interconnections, by cutting through unused portions of the array. This method does not, however, lend itself to passivation.

Masks for the production of wafers and the formation of interconnections are extremely expensive, so that the manufacture of custom wafers is not economically practical for the production of chips in quantities less than hundreds of thousands. Yet there are many instances in which only a few thousand chips of any particular design are required. In order to economically produce such quantities, a wafer must be able to carry a large number of IC arrays of varying sizes for different purposes and/or different customers. This allows many different IC chips to be produced simultaneously with a single mask.

Problems arise in carrying out the latter method with either of the traditional types of wafers. In a standard-size array wafer, the array size must be large enough to accommodate the largest IC to be produced on the wafer. Consequently, substantial portions of the array are wasted for smaller ICs. Borderless arrays can be cut as desired to fit various-sized ICs on a wafer without substantial waste; however, borderless arrays, which are uniform throughout the wafer surface, do not lend themselves to passivation. Passivation structures can only be formed where the wafer substrate is accessible, i.e. where no transistor array has been formed on the wafer.

It is therefore desirable to provide a fabrication method which allows many ICs of varying sizes to be formed on a uniform generic wafer, yet allows passivation structures and guard rings to be formed around each individual IC regardless of its size or shape.

SUMMARY OF THE INVENTION

The invention overcomes the deficiencies of the prior art by forming on the surface of the wafer a borderless array composed of micro arrays or blocks about 200×200 $\mu$m in size separated by about 10 $\mu$m wide strips in which the substrate is exposed. ICs are formed by metallizing sets of blocks which together have the requisite size and shape for the desired IC. The strips consume about 10% of the wafer surface, but the exposure of the substrate in the strips makes it possible to form passivation structures and (by forming areas of $p_+$ and/or $n_+$ diffusion in the strip) guard rings around any selected set of blocks. The 10 $\mu$m gap between blocks is not sufficient to interfere with the transmission of signals between gates in adjacent blocks.

In an additional aspect of the invention, unused blocks or portions of blocks within the layout of a particular IC may be metalized to form input/output connection pads. The versatility of the wafer can be improved by providing alternate rows or columns with various types of application-specific gate elements, such as transistors designed for use in analog or digital circuits; mixtures of transistors and resistors; or combinations of these.

In still another aspect of the invention, a variety of different layers and/or circuits can be metalized with a single mask by arranging all necessary patterns on the mask, and then covering all except the desired pattern during exposure.

BRIEF DESCRIPTION OF THE DRAWINGS

FIG. 4a is a plan view of one form of block;

FIG. 4b is a plan view showing exemplary metallizations of the block of FIG. 4a;

FIG. 8 is a plan view illustrating the use of the mask of FIG. 7a.

DESCRIPTION OF THE PREFERRED EMBODIMENTS

Figure 1:
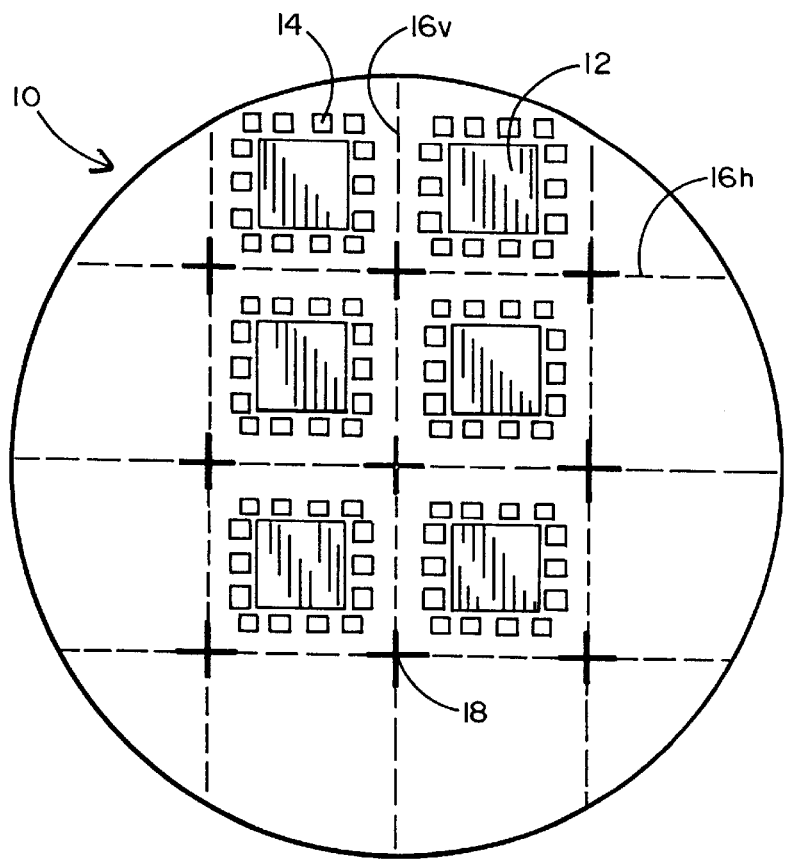
FIG. 1 is a plan view of a prior art wafer.

FIG. 1 illustrates a typical conventional wafer 10. Individual gate arrays or dies 12 surrounded by connection pads 14 are formed on the surface of wafer 10 in a row-and-column pattern. The dies 12 with their connection pads 14 are separated from one another by wide vertical and horizontal scribe lines 16v and 16h. The marks 18 allow precise registration of the metalizing masks with the dies 12 during the subsequent metalizing operation in the manufacture of ICs. $p^+$ and $n^+$ diffusions for guard rings are formed in the scribe lines 16v and 16h around the dies 12 concurrently with the gate arrays 12, and metallic passivation structures are formed along the peripheries of the dies 12 concurrently with the formation of the metallic connection pads 14. Following metalization, the wafer 10 is cut along the scribe lines 16v, 16h to produce individual IC chips.

In a typical wafer such as that depicted in FIG. 1, the dies 12 may be, for example, about 2 mm by 3 mm in size. In general, the granularity of this type of wafer is in the millimeter range.

Figure 2:
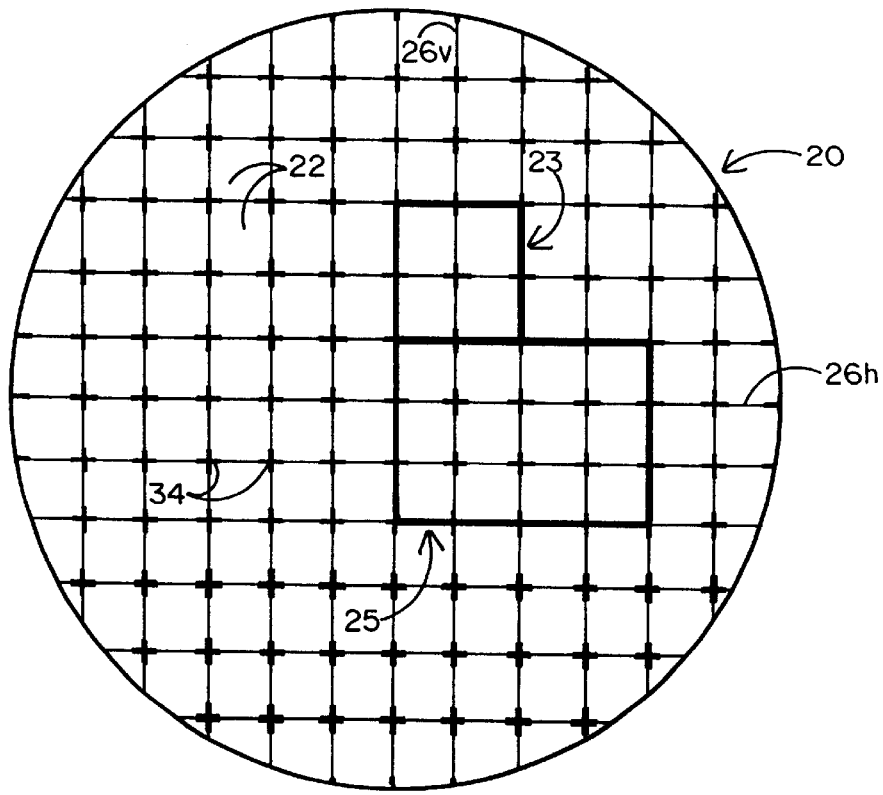
FIG. 2 is a plan view of the inventive wafer.

FIG. 2 shows a wafer 20 according to the invention. The dies on the wafer 20 are formed as small blocks 22 without connection pads (i.e. blocks in which the transistors or gates occupy essentially the entire width and height of the block), and are about 200×200 µm in size. The blocks 22 are separated by scribe lines 26v and 26h about 10 µm wide, in which the wafer substrate is exposed for the formation of guard ring diffusions 36, 38, 40 (FIG. 3) and alignment marks 34. The granularity of the inventive wafer 20 can thus be in the 100–200 µm range. Any desired number of blocks can be combined together during metalization, in sets such as 23 and 25, as described below to form IC chips of any desired size. This makes it possible to fabricate a variety of chips of different sizes on a single wafer.

Figure 3:
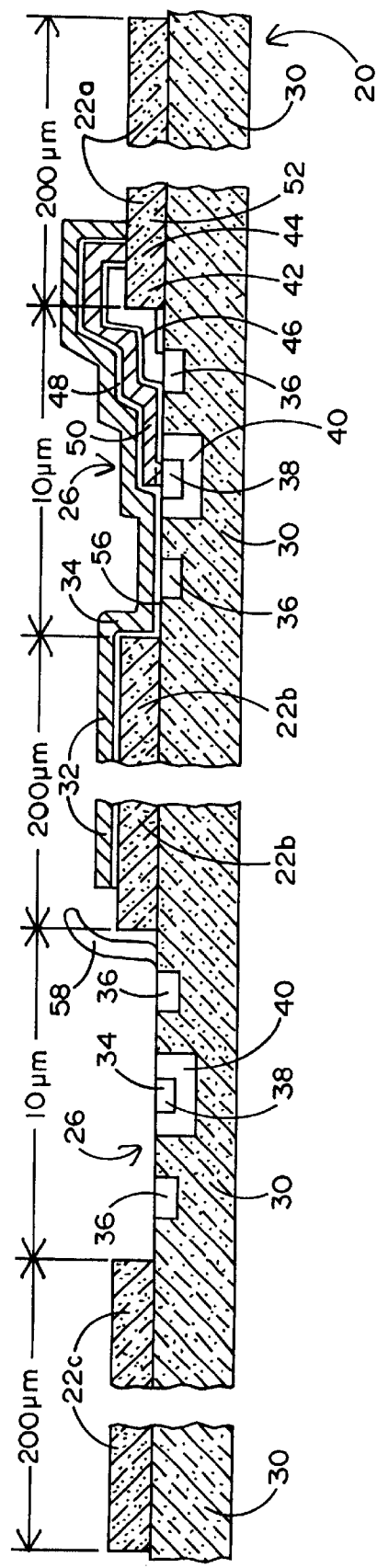
FIG. 3 is an enlarged partial cross section of a wafer according to the invention.

FIG. 3 illustrates the ability of the inventive structure to provide guard rings and passivation structures around any desired set of the blocks 22. In FIG. 3, 30 denotes the p– substrate of the wafer 20. 22a, 22b and 22c are blocks of transistors. Block 22a is a circuitry block which, together with other adjacent blocks, forms part of an integrated circuit. Block 22b is a block used to support an input/output connection pad 32, and block 22c is an unused block. The wafer 20 may eventually be cut through the block 22c, or on the scribe line 26. Alignment marks 34 for that purpose are made on the substrate 30.

Each of the scribe lines 26 contains guard ring connections 36, 38. The connections 36 are preferably p+ diffusions in the p– substrate 30, while the connection 38 is a p– diffusion in an n+ diffusion 40 in the p– substrate 30. The diffusions 36, 38 are connected to guard ring areas 42, 44, respectively, on the perimeter of the outermost circuitry block 22a by metallization layers 46, 48 separated by an insulation layer 50.

A selected transistor 52 of the circuitry of block 22a may be connected to the input/output pad 32 by a metalization 54 deposited over an insulation layer 56. The transistors in block 22b are unconnected and inactive. A metalization like 54 may also be used to interconnect transistors on adjacent blocks to form a multi-block circuit.

A passivation structure 58 connected to the substrate 20 can be formed during metalization around the periphery of the set of blocks 22 which, after cutting of the wafer, will constitute the finished IC chips.

Figure 5:
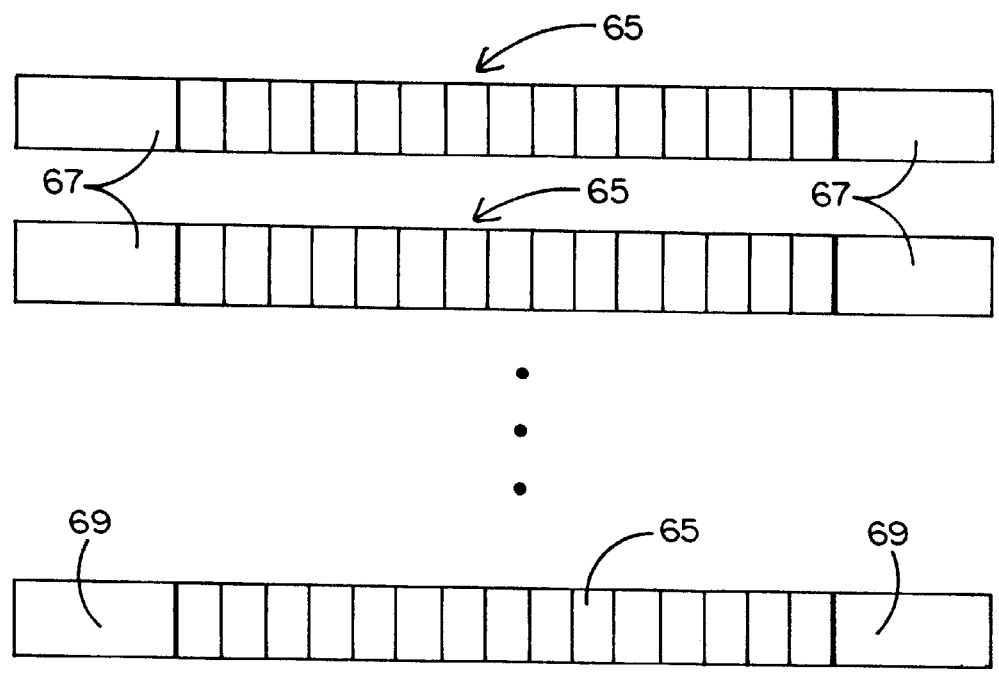
FIG. 5 is a plan view of another form of block.

The block approach of this invention lends itself well to the manufacture of various chip configurations. For example, the blocks 22 may, for example, contain rows or columns of alternating fixed-length strips of n– transistors and p– transistors 59 for digital use FIG. 4a). The transistors 57, 59 can be interconnected with each other and with input-output pads 61 by metalization interconnections 63 (FIG. 4b). Alternatively, the blocks 22 may contain analog cells or strips 65 that have special function transistors 67 at each end (FIG. 5), resistive or other components 69, or mixtures of these.

Figure 6:
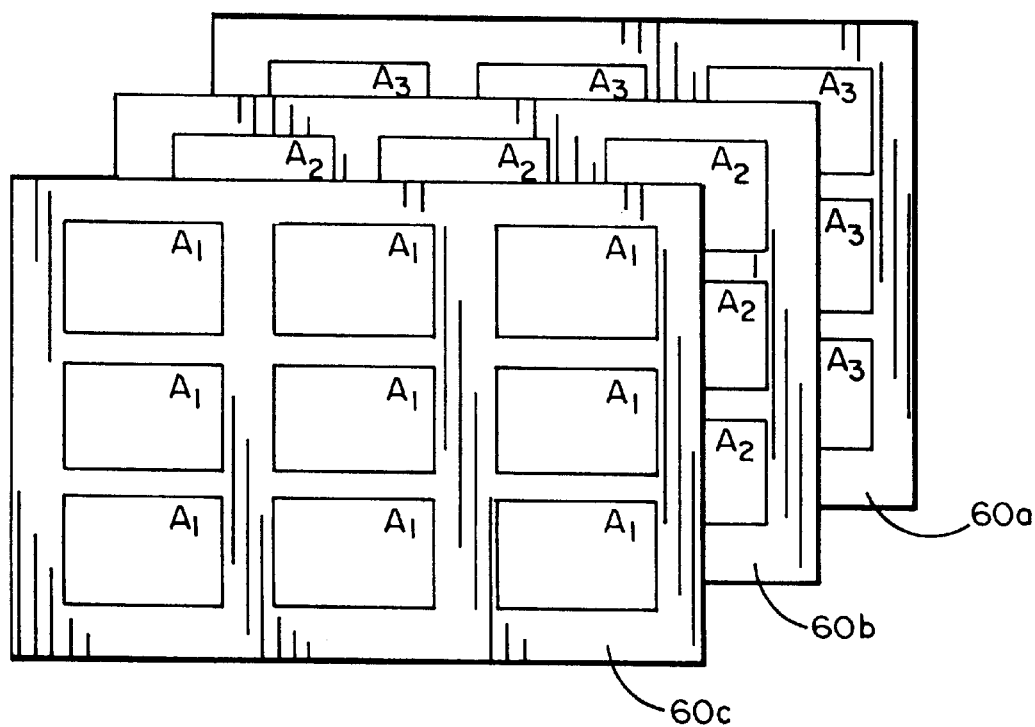
FIG. 6 is a perspective view illustrating the use of separate masks for each layer.
Figure 7A:
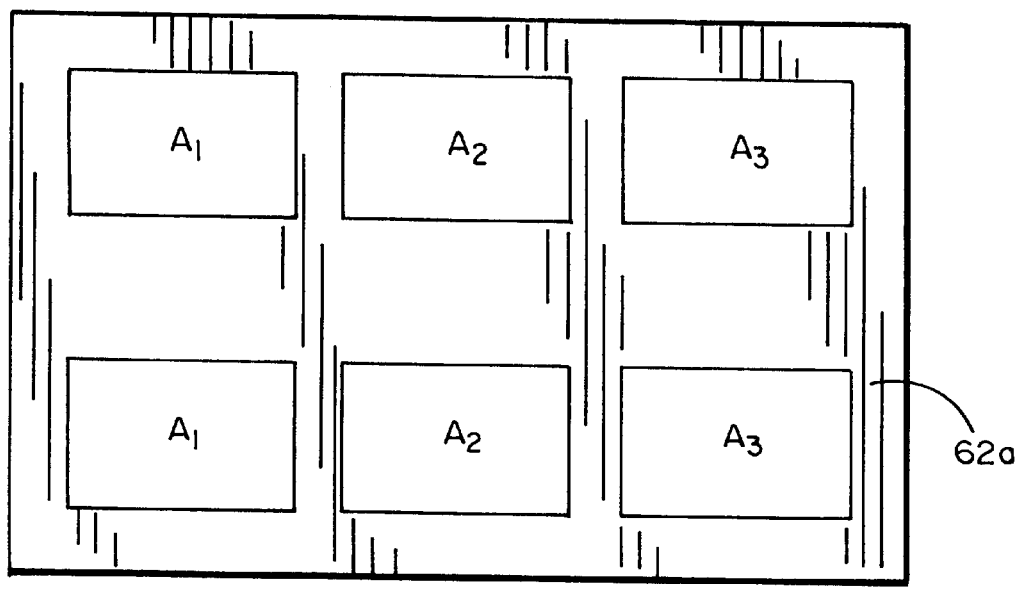
FIGS. 7a and 7b are plan views of multi-layer masks according to the inventions.
Figure 7B:
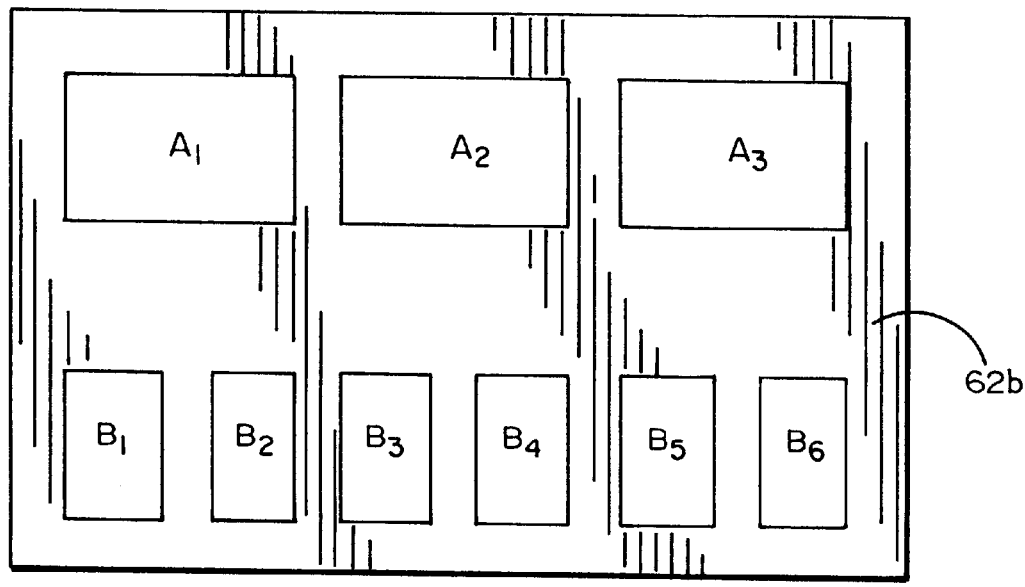
Figure 8:
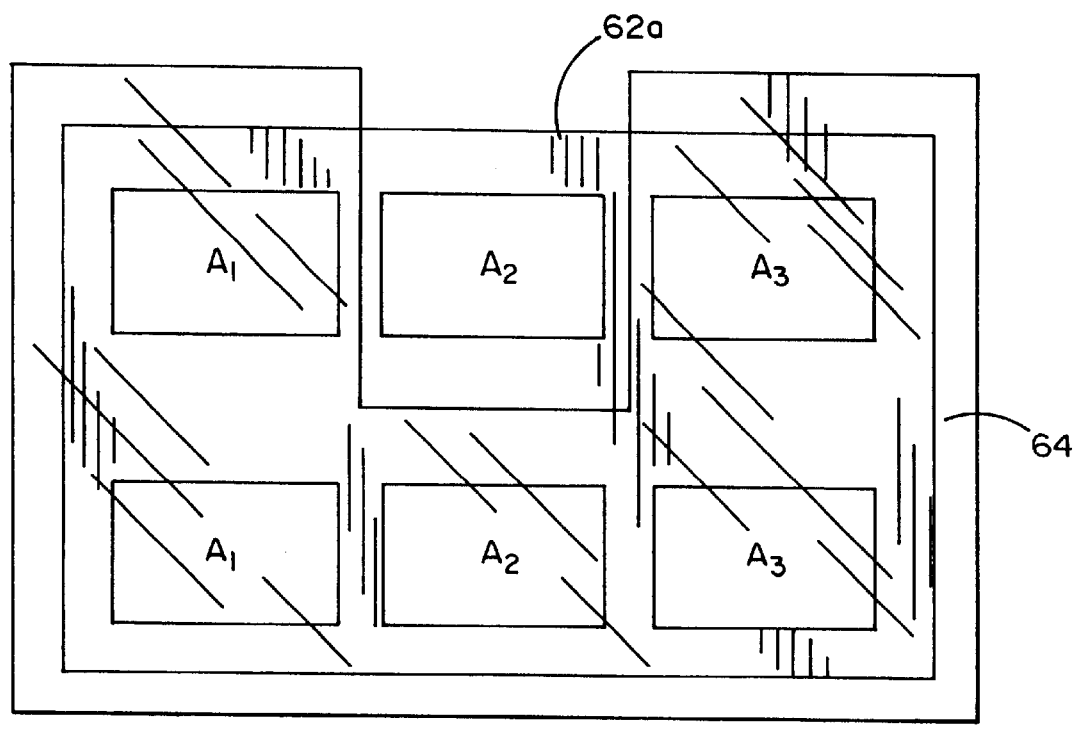

In view of the high cost of metalization masks, it is highly desirable in chip manufacture to reduce their number. Typically, a separate mask 60a, 60b, 60c (FIG. 6) is provided for each metalization layer to form successive layer patterns A1, A2 and A3. In accordance with the invention, a single mask can frequently be shared by several layers in which patterns are repetitive. This can be done by placing all of the patterns A1, A2 and A3 (or, for example A1 through A3 and B1 through B6 for a multi-project wafer) onto a single mask 62a or 62b (FIGS. 7a and 7b), appropriately aligning the mask for each layer, and then blocking off all but the desired pattern with an opaque cover 64 (FIG. 8) so that only the desired pattern is exposed. The exposure in this approach must, of course, be carefully controlled.

It will be seen that the present invention provides a versatile, cost-saving and area-efficient method of fabricating different kinds and sizes of IC chips on a single borderless gate-array wafer with improved passivation while providing guard rings and alignment marks on the wafer substrate, that are effectively usable for all shapes and sizes of ICs. It should be understood that the method described herein and shown in the drawings represents only a presently preferred embodiment of the invention. Various modifications and additions may be made to that embodiment without departing from the scope and spirit of the invention.

What is claimed is:

1. A method of fabricating a multi-project, integrated circuit wafer, comprising the steps of:
    a) forming on a substrate a borderless gate array wherein the gates of the array are arranged in a continuous array of rows and columns of discrete blocks separated by scribe lines in which said substrate is exposed; and
    b) forming a passivation structure on said exposed substrate in said scribe lines.

2. The method of claim 1, further comprising the step of forming in said scribe lines diffusions for the establishment of guard rings.

3. The method of claim 1, further comprising the step of metalizing a selected plurality of said blocks to interconnect them for producing an integrated circuit.

4. The method of claim 3, further comprising the step of metalizing selected blocks in said plurality of blocks to form input/output connection pads.

5. The method of claim 3, further comprising the step of cutting said substrate along the scribe lines surrounding said selected plurality of blocks to form an integrated circuit chip.

6. The method of claim 3, further comprising the step of cutting said substrate through blocks adjoining said selected plurality of blocks to form an integrated circuit chip.

7. The method of claim 1, in which said blocks consist of rows or columns of circuit elements extending the full width or height of the block.

8. The method of claim 7, in which said circuit elements include resistors.

9. The method of claim 7, in which said circuit elements include transistors.

10. The method of claim 9 in which said transistors include analog circuit transistors.

11. The method of claim 9, in which said transistors include digital circuit transistors.

12. The method of claim 3, in which said metalizing step includes the successive metalization of a plurality of layers through a single pattern-defining mask, said mask carrying the metalization patterns of a plurality of layers, and said mask being so covered as to expose only a selected portion of said mask during each successive metalization.

13. The method of claim 12, in which said mask carries selectably coverable patters of a plurality of different circuits.

* * * * *